(12) United States Patent
Chan

(10) Patent No.: US 8,494,455 B2
(45) Date of Patent: Jul. 23, 2013

(54) METHODS AND APPARATUS FOR A RESONANT TRANSMIT/RECEIVE SWITCH WITH TRANSFORMER GATE/SOURCE COUPLING

(75) Inventor: Ngar Loong A. Chan, San Jose, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 326 days.

(21) Appl. No.: 12/621,856

(22) Filed: Nov. 19, 2009

(65) Prior Publication Data

US 2011/0115572 A1 May 19, 2011

(51) Int. Cl.
*H04B 1/38* (2006.01)

(52) U.S. Cl.
USPC .......... 455/73; 455/78; 455/83; 333/32; 331/175

(58) Field of Classification Search
USPC .......... 455/83, 341, 73, 77, 78; 333/32, 333/172, 101, 103, 104
See application file for complete search history.

(56) References Cited

U.S. PATENT DOCUMENTS

| | | | |
|---|---|---|---|
| 5,697,069 A | 12/1997 | Bohm et al. | |
| 6,721,544 B1 * | 4/2004 | Franca-Neto | 455/83 |
| 6,784,837 B2 | 8/2004 | Revankar et al. | |
| 7,081,796 B2 | 7/2006 | Krone | |
| 7,209,727 B2 * | 4/2007 | Castaneda et al. | 455/341 |
| 7,936,237 B2 * | 5/2011 | Park et al. | 333/103 |
| 2002/0070720 A1 | 6/2002 | L'hermite et al. | |
| 2004/0157579 A1 | 8/2004 | Namura | |
| 2005/0208917 A1 | 9/2005 | Roufoogaran et al. | |
| 2006/0046681 A1 | 3/2006 | Bagheri et al. | |
| 2006/0055470 A1 | 3/2006 | Luong et al. | |
| 2008/0207256 A1 | 8/2008 | Chan | |
| 2009/0017775 A1 | 1/2009 | Qiao | |
| 2009/0029654 A1 * | 1/2009 | Fu et al. | 455/83 |
| 2009/0128244 A1 | 5/2009 | Deng et al. | |

(Continued)

FOREIGN PATENT DOCUMENTS

| | | |
|---|---|---|
| DE | 102005020084 A1 | 11/2006 |
| EP | 2037591 A2 | 3/2009 |
| GB | 2438751 A | 12/2007 |
| WO | WO2009009646 A2 | 1/2009 |

OTHER PUBLICATIONS

International Search Report and Written Opinion—PCT/US2010/057528—International Search Authority, European Patent Office, Feb. 10, 2011.

(Continued)

*Primary Examiner* — Ping Y Hsieh
*Assistant Examiner* — Chung-Tien Yang
(74) *Attorney, Agent, or Firm* — Ramin Mobarhan

(57) ABSTRACT

Methods and apparatus for a resonant transmit/receive switch with transformer gate/source coupling. The resonant transmit/receive (T/R) switch includes a switchable inductor having a first inductance value for use in receive (Rx) mode and a second inductance value for use in transmit (Tx) mode. The first inductance value is used for input matching to a low noise amplifier in Rx mode. The second inductance value is selected to resonant with parasitic capacitance of the antenna port to produce a high impedance in Tx mode. In one implementation, the switchable inductor is gate sourced coupled to at least one of first and second inductors of a low noise amplifier (LNA), thereby allowing use of smaller inductors due to the resulting coupling factor.

17 Claims, 15 Drawing Sheets

U.S. PATENT DOCUMENTS

2010/0029227 A1    2/2010    Narathong et al.
2011/0279184 A1    11/2011    Chan et al.
2012/0161879 A1    6/2012    Leong et al.
2012/0161880 A1    6/2012    Sutardja et al.

OTHER PUBLICATIONS

Jeongmin Jeon Kuhn, W.B.; "A UHF CMOS Transceiver Front-End With a Resonant TR Switch" Radio and Wireless Symposium, 2007 IEEE; Digital Object Identifier: 10.1109/RWS.2007.351760; Publication Year: 2007, pp. 71-74.

Adabi et al., "A mm-Wave Transformer Based Transmit/Receive Switch in 90nm CMOS Technology," European Microwave Conference, EuMC, Oct. 2009, pp. 389-392.

David Alldred et al., "A 1.2V, 60-GHz radio receiver with on-chip transformers and inductors in 90-nm CMOS", Compound Semiconductor Integrated Circuit Symposium, 2006, CSIC 2006, IEEE, IEEE, Piscataway NJ USA Nov. 1, 2006, pp. 51-54, XP031051648, ISBN: 978-1-4244-0126-0.

Razavi et al, "A UWB CMOS transceiver," IEEE Journal of Solid-State Circuits, Dec. 2005, pp. 2555-2562, vol. 40, No. 12.

Zito D et al: "A Novel LNA Topology with Transformer-based Input Integrated Matching and its 60-GHz Millimeter-wave CMOS 65-nm Design", Electronics, Circuits and Systems, 2007. ICECS 2007. 14TH IEEE International Conference on, IEEE, Piscataway, NJ, USA, Dec. 11, 2007, pp. 1340-1343, XP031248509, ISBN: 978-1-4244-1377-5.

* cited by examiner

METHODS AND APPARATUS FOR A RESONANT TRANSMIT/RECEIVE SWITCH WITH TRANSFORMER GATE/SOURCE COUPLING

BACKGROUND

1. Field

The present application relates generally to the operation and design of a transmit/receive switch for use in portable devices, and more particularly, to methods and apparatus for a resonant transmit/receive switch with transformer gate/source coupling.

2. Background

Efficient signal transmission and reception is especially important in portable devices due to limits on circuitry size and power constraints. Typically, such devices include an antenna port that is coupled to a transmit/receive (TR) switch that routes received signals to a low noise amplifier (LNA) in receive (Rx) mode and transmit signals to the antenna in transmit (Tx) mode.

Typically, the antenna port will have some level of parasitic capacitance that needs to be accounted for to provide optimum transmit and receive operations. However, conventional resonant transmit/receive (TR) switches may not be optimally tuned for both transmit and receive operations. For example, conventional switches may be optimized for Tx mode but fail to provide the optimum noise/power match during Rx mode. Also, conventional switches may utilize many components and require a large circuit size.

Therefore, it would be desirable to have a resonant T/R switch that can be optimally tuned for both Rx and Tx mode and which reduces component count, costs, and/or circuit size when compared to conventional switches.

BRIEF DESCRIPTION OF THE DRAWINGS

The foregoing aspects described herein will become more readily apparent by reference to the following Description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
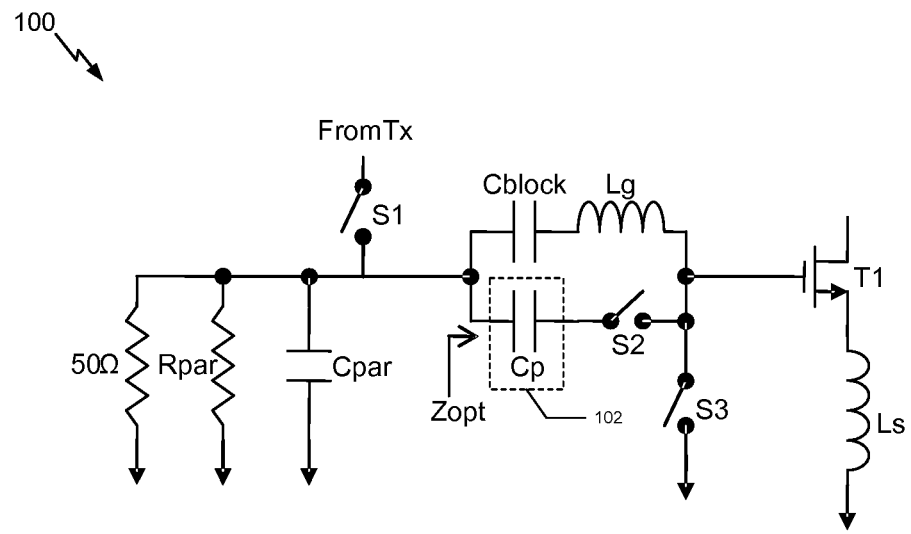
FIG. 1 shows a conventional resonant T/R switch operating in Rx mode for use a radio transceiver.

FIG. 1 shows a conventional resonant T/R switch 100 operating in Rx mode for use in a radio transceiver. To operate in this mode, switches S1-S3 are placed in the open position so that capacitor Cp is switched out of the circuit, as illustrated by the dashed box 102. This allows inductor Lg to provide gate matching for operation in the Rx mode.

Figure 2:
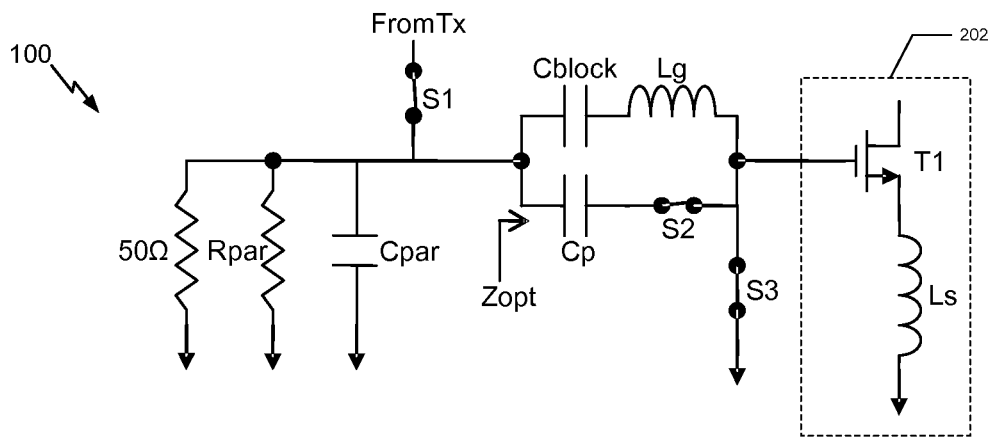
FIG. 2 shows a conventional resonant T/R switch operating in Tx mode for use a radio transceiver.

FIG. 2 shows the conventional resonant T/R switch 100 operating in Tx mode for use in a radio transceiver. To operate in this mode, switches S1-S3 are placed in the closed position so that the capacitor Cp is switched into the circuit. Furthermore, transistor T1 and inductor Ls are switched out of the circuit, as illustrated by the dashed box 202. The combination of the inductor Lg and capacitor Cp forms a resonant tank. Unfortunately, the large value of Lg chosen for Rx mode for optimum noise/power matching in Rx mode may not handle a large parasitic capacitance for Cpar in Tx mode.

Exemplary embodiments of the invention operate to provide one or more of the following functions to overcome the problems associated with conventional circuits.

1. Provide switchable inductor to provide a range of inductance values to produce high impedance in Tx mode.
2. Gate-source coupling for reduced inductance.
3. High input power auto gain control in Rx bypass mode.

Switchable Inductor

Figure 3:
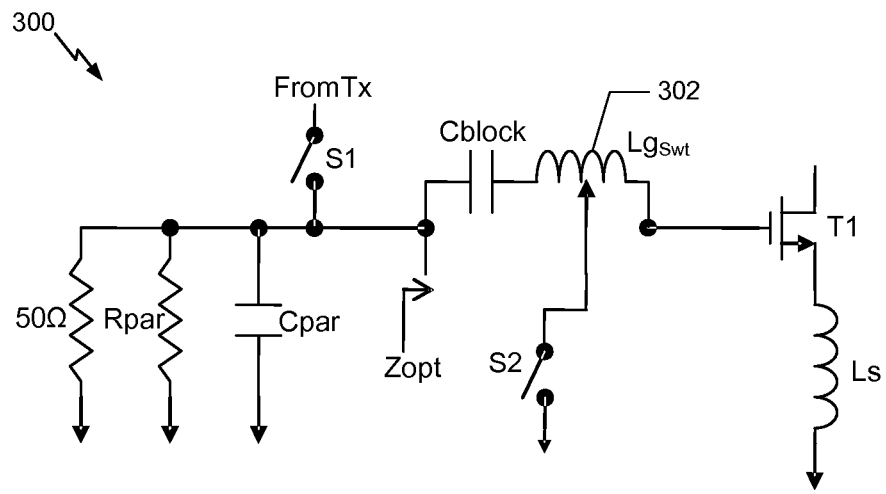
FIG. 3 shows an exemplary resonant T/R switch operating in Rx mode for use a radio transceiver.

FIG. 3 shows an exemplary resonant T/R switch 300 constructed in accordance with exemplary embodiments of the invention. The switch 300 comprises switches S1-S2 which are set for operation in Rx mode. The switch 300 also comprises a switchable (i.e., tunable) inductor $Lg_{Swt}$ 302. The switchable inductor $Lg_{Swt}$ 302 comprises an inductor with one or more fixed stops (or taps) providing selectable inductance values to allow selection of any inductance value within the full range of the overall inductance value. During Rx mode, switches S1-S2 are set to the open position. It should be noted that the switch 300 does not include parallel capacitor Cp as included in the prior art circuits. Thus, during receive mode operation, the full inductance value of the switchable inductor $Lg_{Swt}$ 302 is utilized and the elimination of Cp helps reduce parasitic capacitance, component count and space requirements.

Figure 4:
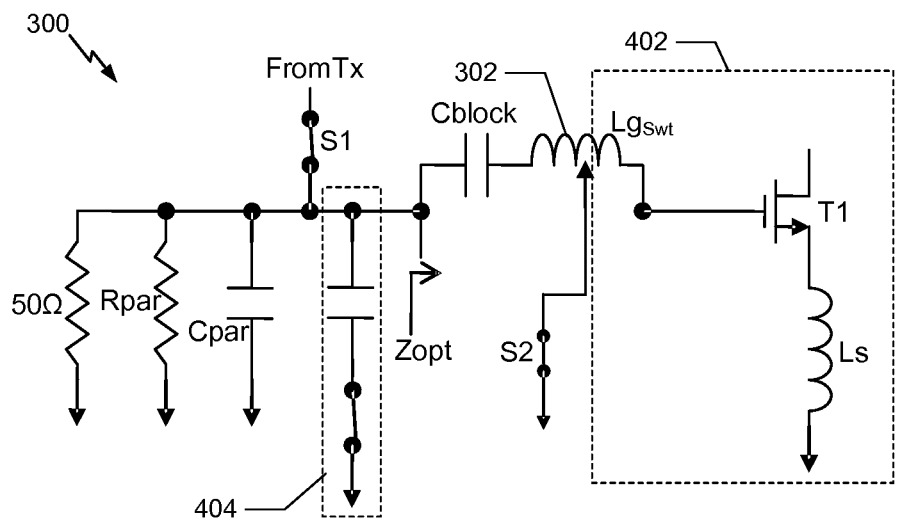
FIG. 4 shows an exemplary resonant T/R switch operating in Tx mode for use a radio transceiver.

FIG. 4 shows the exemplary resonant T/R switch 300 configured for operation in the Tx mode. For Tx mode operation, the switches S1-S2 are set to the closed position. By closing switch S2 a portion of the switchable inductor $Lg_{Swt}$ 302, transistor T1 and inductor Ls are switched out of the circuit as illustrated by box 402. Thus, the switch 300 is designed to switch a portion of the inductor $Lg_{Swt}$ 302 out of the circuit during Tx mode instead of switching the capacitor Cp into the circuit as in the conventional circuit shown in FIG. 2. The result is that a smaller inductor value is used during Tx mode, which means larger parasitic capacitance can be handled. Furthermore, fewer components are used since Cp and switch S2 used in the conventional circuit are eliminated. The use of fewer components reduces circuit area and thus costs.

In another embodiment, the switch 300 can be further modified by selecting the value of the inductor $Lg_{Swt}$ 302 to be even smaller and incorporating a switchable capacitor at the antenna port, as illustrated at 404, for further tuning which improves first time silicon success and yield.

Gate-source Coupled Inductors

Figure 5:
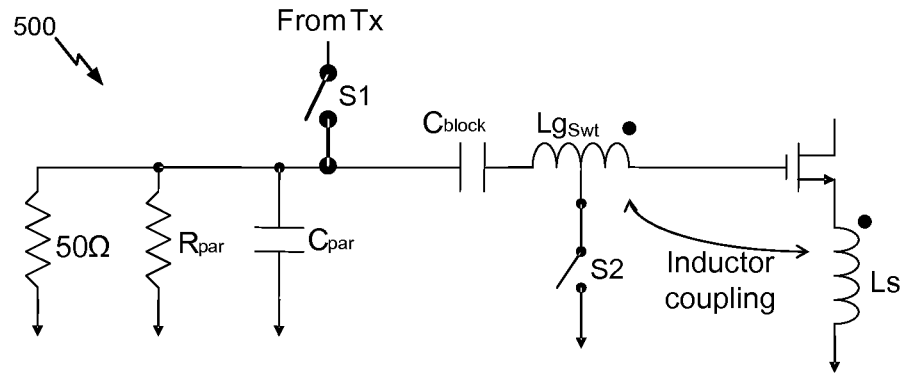
FIG. 5 shows an exemplary resonant T/R switch constructed with a gate-source coupled inductors.

FIG. 5 shows an exemplary resonant T/R switch 500 in Rx mode and constructed with gate-source coupled inductors. As illustrated in FIG. 5, the switchable inductor $Lg_{Swt}$ is coupled with inductor Ls. As a result, the mutual inductance allows the value of the inductors $Lg_{Swt}$ and Ls to be reduced. This also reduces the parasitic resistance and capacitance. A high coupling factor is not needed to achieve this reduction, for example, any achievable coupling factor can be used obtain reduced parasitic resistance and capacitance. FIG. 5 illustrates single ended mode however, similar coupling can be performed in differential mode as illustrated in FIG. 6.

Overall Design

Figure 6:
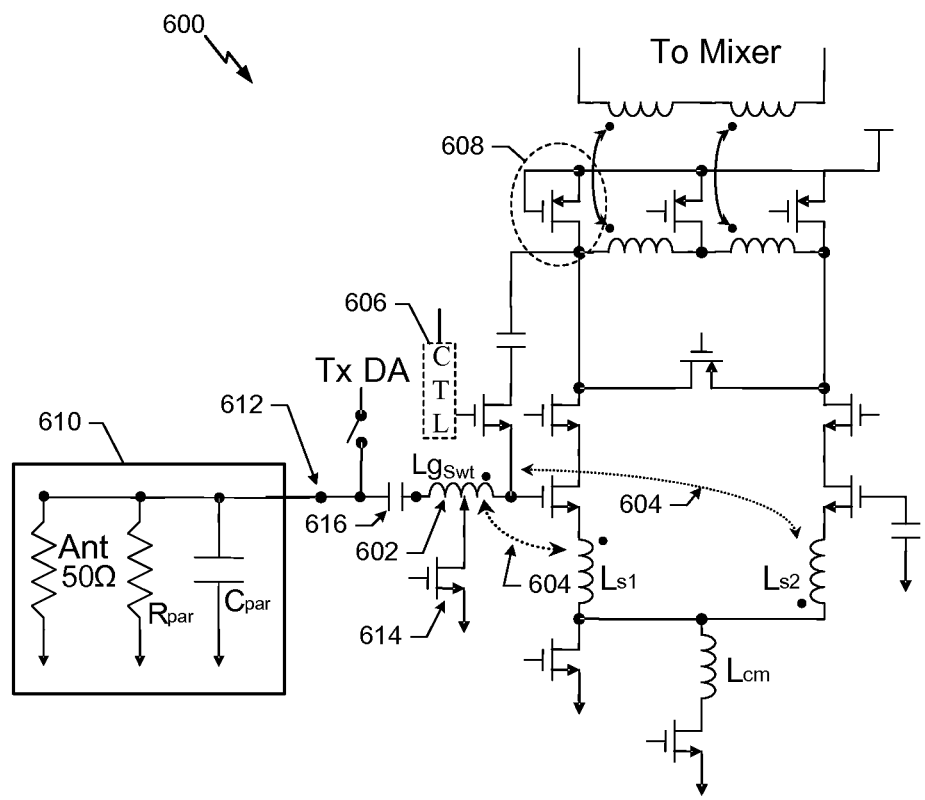
FIG. 6 shows an exemplary resonant T/R switch constructed in accordance with exemplary embodiments of the invention.

FIG. 6 shows an exemplary resonant T/R switch 600 with LNA for Rx mode constructed in accordance with exemplary embodiments of the invention. The switch 600 comprises a cascode design with a switchable inductor $Lg_{Swt}$ 602 forming a resonant switch. A tap of the switchable inductor 602 is coupled to transistor 614 which is turned on in Tx mode to allow selection of a particular inductance value. The switch 600 also comprises gate-source coupled inductors where inductors ($Lg_{Swt}$, Ls1, Ls2) are coupled, as shown at 604, for area reduction and reduced parasitic capacitance. The switch 600 further comprises a high power auto gain control circuit 606. To balance differential signals in differential mode, a dummy PMOS 608 is also provided. An antenna port 610 is coupled to a first node 612, which is coupled to the switchable inductor 602 through capacitor 616. A more detailed description of the various features and operating modes of the switch 600 is provided below.

Single Ended Rx Mode (High Gain)

Figure 7:
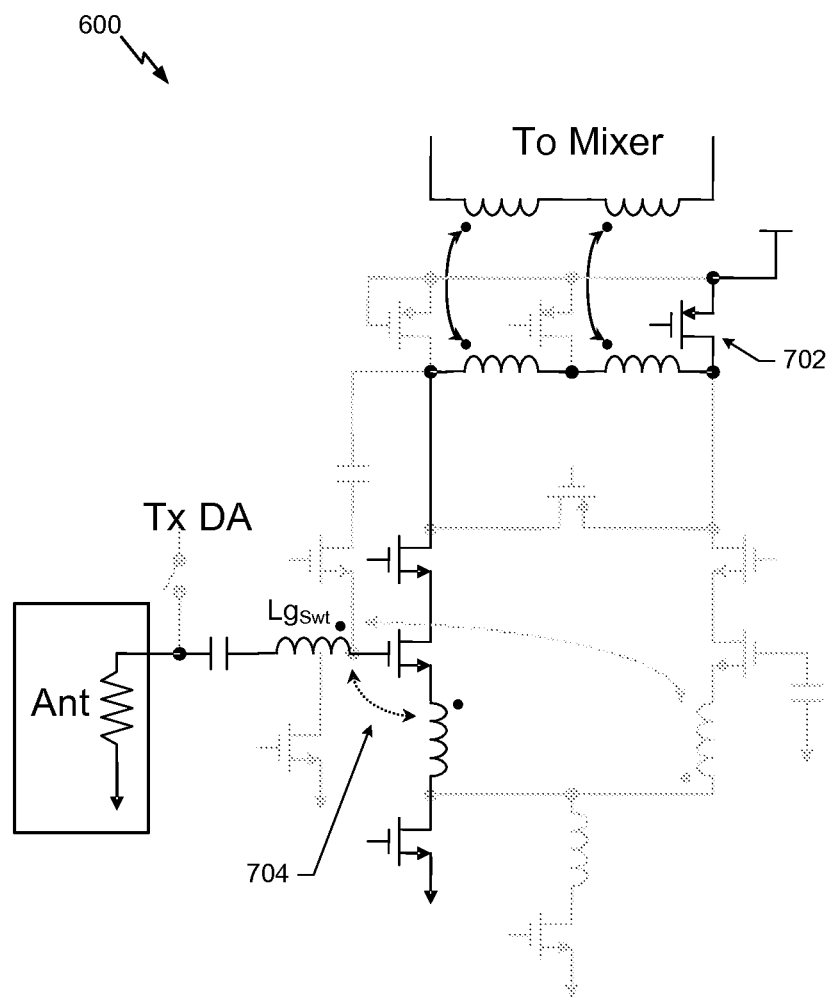
FIG. 7 shows the exemplary resonant T/R switch of FIG. 6 during operation in single ended high gain Rx mode.

FIG. 7 shows the exemplary resonant T/R switch 600 during operation in single ended high gain Rx mode. To clearly illustrate this operation, only the relevant portions of the switch 600 are highlighted. To implement this mode, a PMOS switch 702 at the output is turned on. Because this is single ended operation, there is only single gate-source coupling as illustrated at 704.

Single Ended Rx Mode (Medium Gain)

Figure 8:
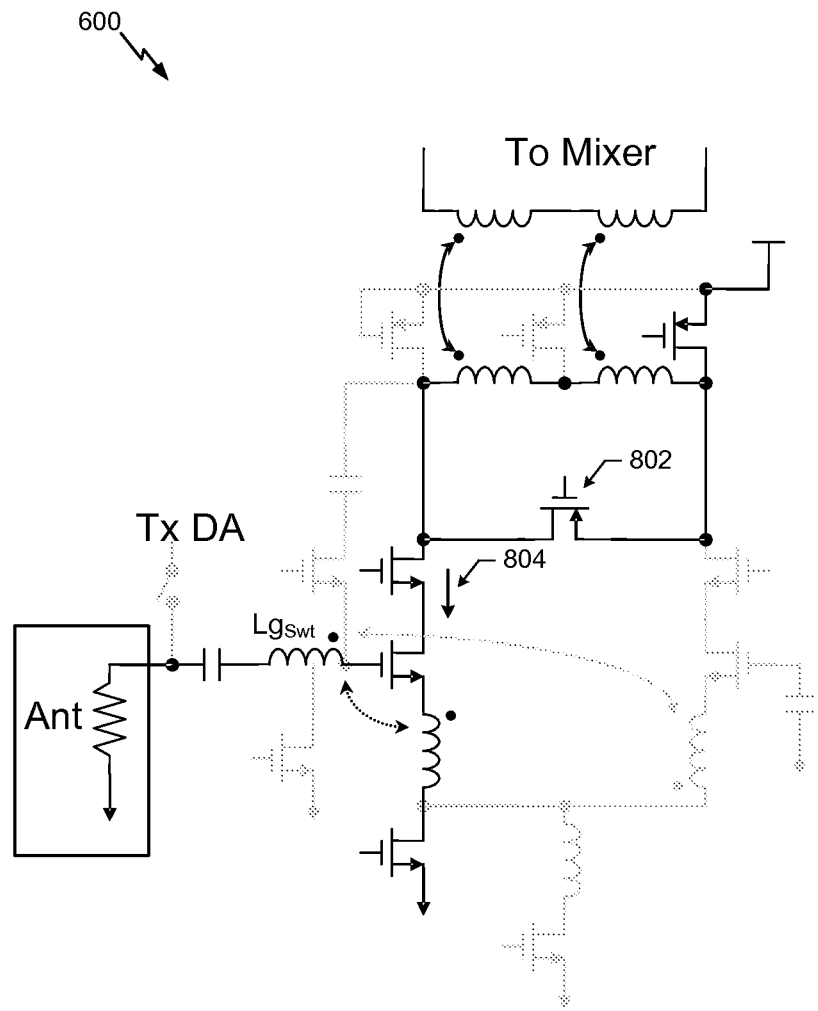
FIG. 8 shows the exemplary resonant T/R switch of FIG. 6 during operation in single ended medium gain Rx mode.

FIG. 8 shows the exemplary resonant T/R switch 600 during operation in single ended medium gain Rx mode. To clearly illustrate this operation, only the relevant portions of the switch 600 are highlighted. The addition of PMOS switch 802 operates to reduce impedance at the output tank and a biasing circuit (not shown) reduces bias current 804 to reduce the gain from the high gain mode.

Differential Rx Mode (High Gain)

Figure 9:
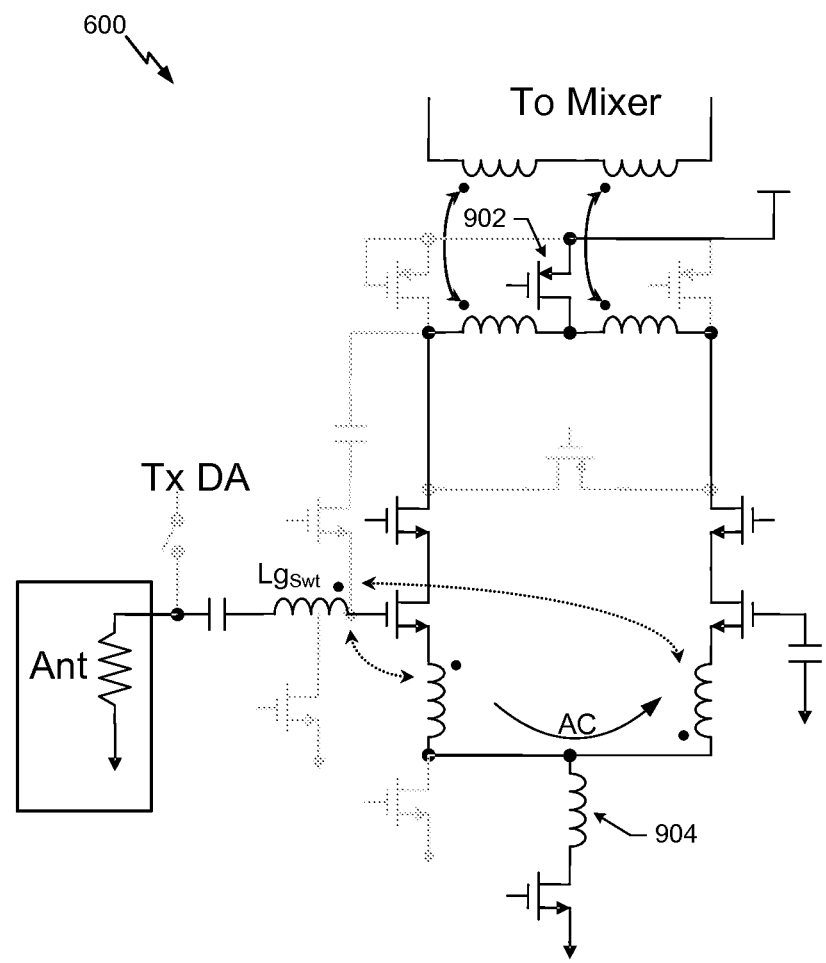
FIG. 9 shows the exemplary resonant T/R switch of FIG. 6 during operation in differential high gain Rx mode.

FIG. 9 shows the exemplary resonant T/R switch 600 during operation in differential high gain Rx mode. To clearly illustrate this operation, only the relevant portions of the switch 600 are highlighted. To implement this mode, PMOS switch 902 is turned on. A common mode inductor 904 is coupled to ground to provide a DC current path and to allow AC to flow through the circuit, since inductor 904 will resonant with parasitic capacitance to form a resonant tank and provide an AC open.

Differential Rx Mode (Medium Gain)

Figure 10:
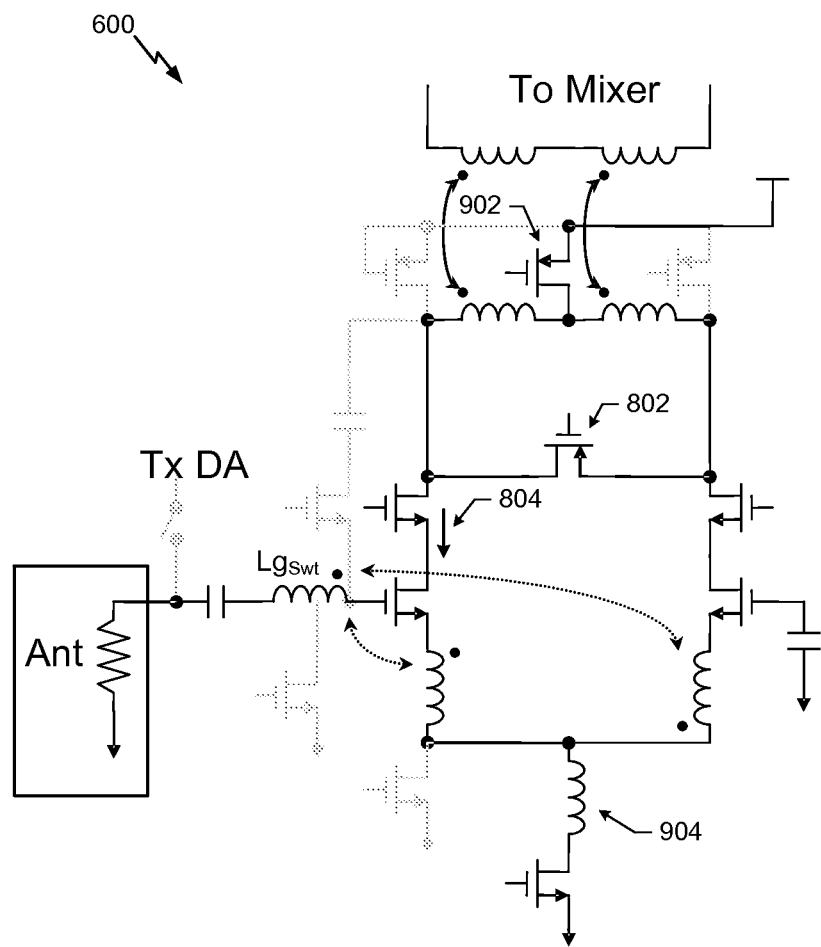
FIG. 10 shows the exemplary resonant T/R switch of FIG. 6 during operation in differential medium gain Rx mode.

FIG. 10 shows the exemplary resonant T/R switch 600 during operation in differential medium gain Rx mode. To clearly illustrate this operation, only the relevant portions of the switch 600 are highlighted. To implement this mode, the PMOS switch 802 is turned on and operates to reduce impedance at the output tank and a biasing circuit (not shown) reduces bias current 804 to reduce the gain from the high gain mode. The common mode inductor 904 is coupled to ground to provide a DC current path and to allow AC to flow through the circuit, since inductor 904 will resonant with parasitic capacitance to form a resonant tank and provide an AC open.

Bypass Mode (Low Gain)

Figure 11:
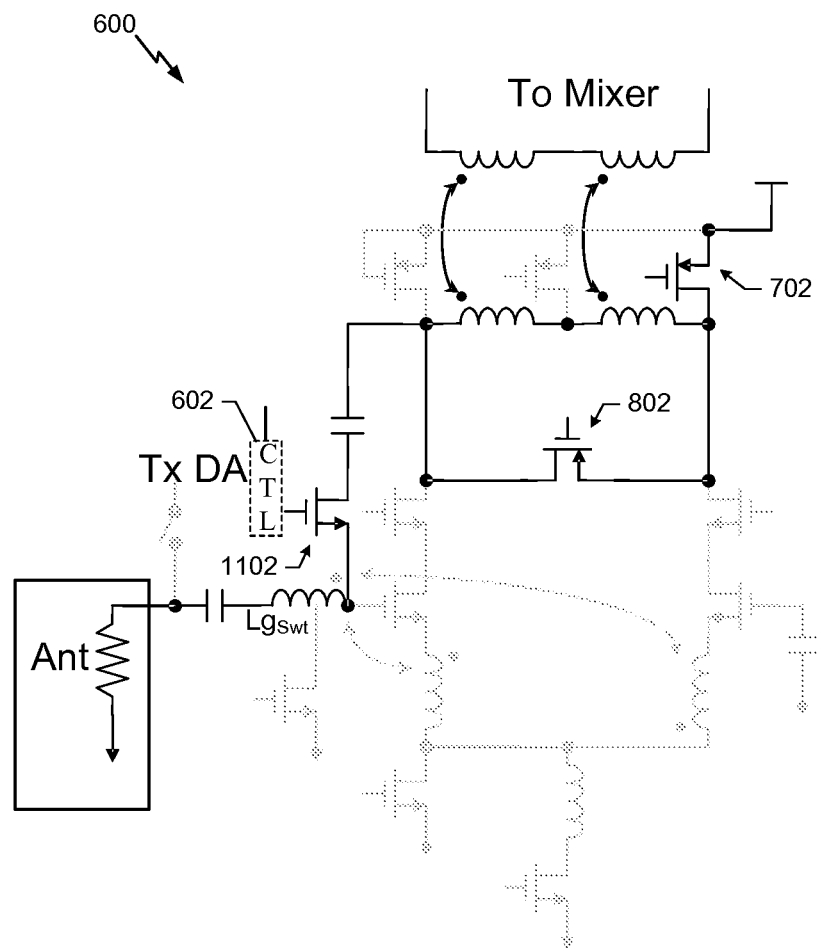
FIG. 11 shows the exemplary resonant T/R switch of FIG. 6 during operation in bypass Rx mode.

FIG. 11 shows the exemplary resonant T/R switch 600 during operation in bypass mode. To clearly illustrate this operation, only the relevant portions of the switch 600 are highlighted. To implement this mode, transistors 702, 802, and 1102 are turned on allowing the input signal to bypass portions of the LNA.

Resonant (Tx) Mode

Figure 12:
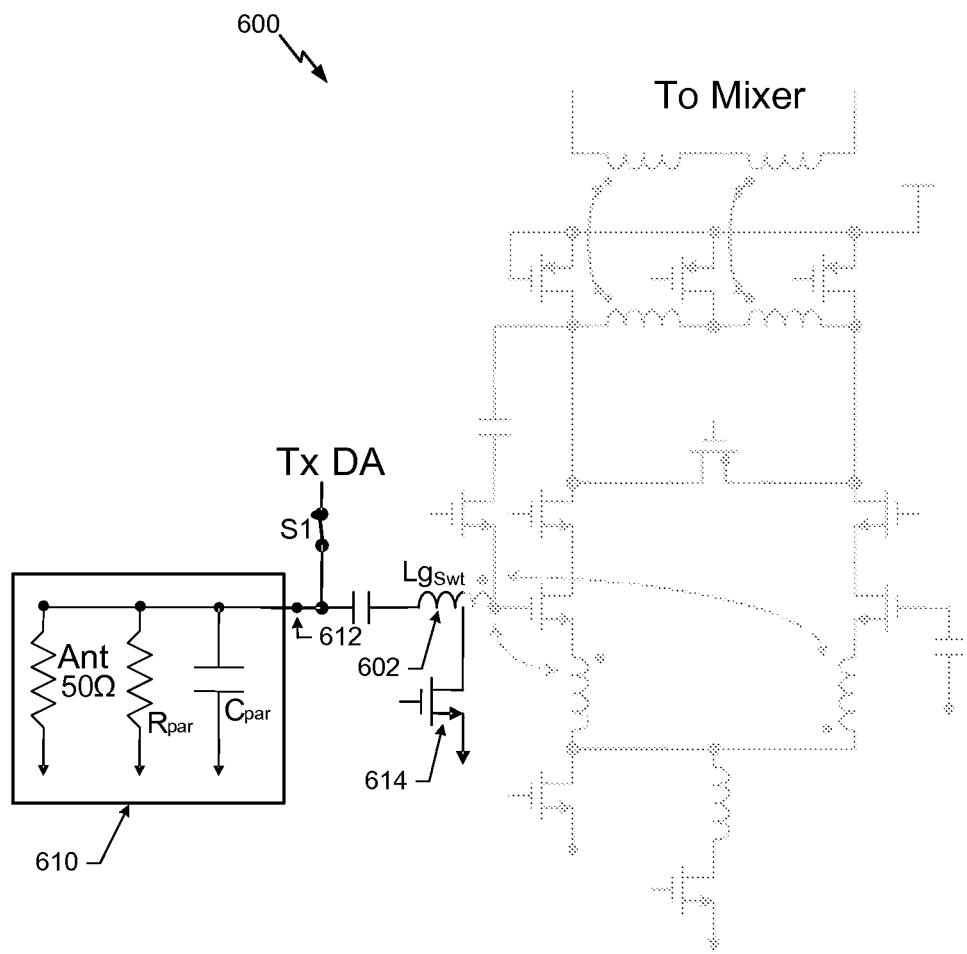
FIG. 12 shows the exemplary resonant T/R switch of FIG. 6 during operation in Tx mode.

FIG. 12 shows the exemplary resonant T/R switch 600 during operation in resonant (Tx) mode. To clearly illustrate this operation, only the relevant portions of the switch 600 are highlighted. To implement this mode, the switch S1 is closed and the transistor 614 is turned on so that part of the inductance of $Lg_{Swt}$ 602 is connected to ground and the remaining part is switched out of the circuit. The selected inductance value of $Lg_{Swt}$ will resonate with all parasitic capacitance seen at the antenna port 610 that is coupled at node 612 to produce high impedance so that the transmit signal will flow to the antenna for transmission.

Input/Output Load Tuning

Figure 13:
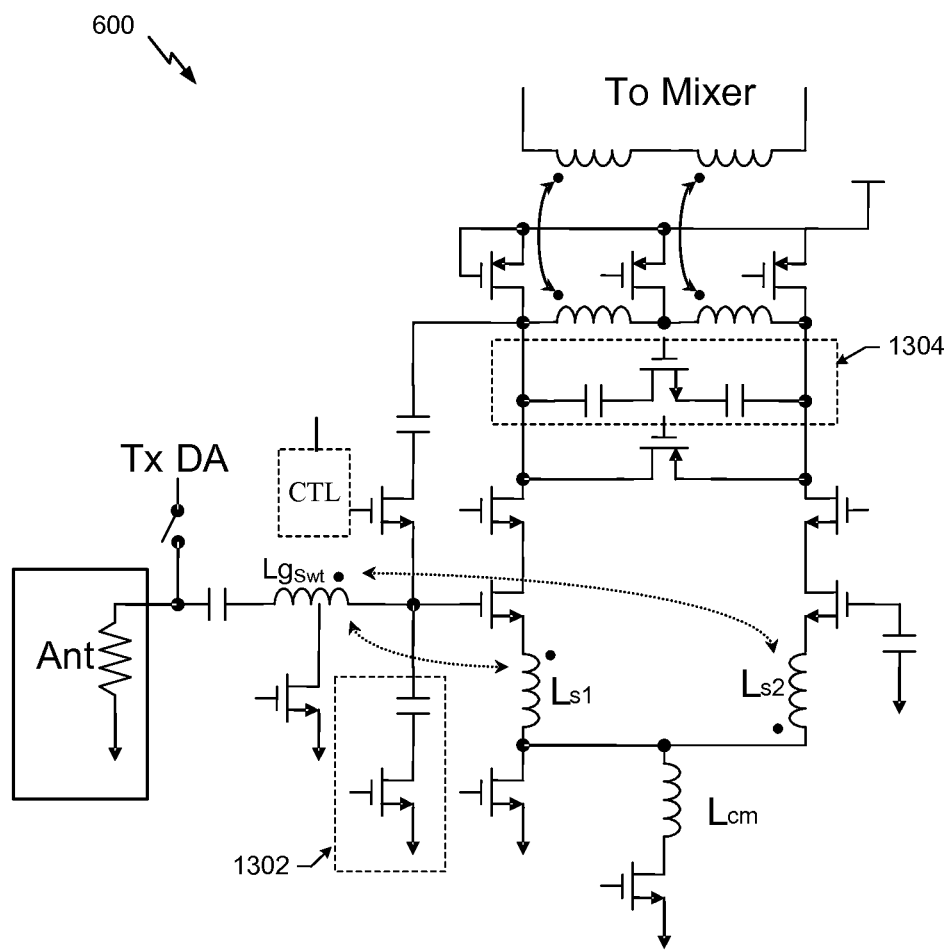
FIG. 13 shows the exemplary resonant T/R switch of FIG. 6 further comprising additional input/output load tuning.

FIG. 13 shows the exemplary resonant T/R switch 600 comprising additional input/output load tuning. The load tuning comprises switchable capacitance at the input and output. For example, a switchable capacitor is located at the input as illustrated by box 1302. Furthermore, switchable capacitors are located at the output as illustrated by box 1304.

Gain Characteristics

Figure 14:
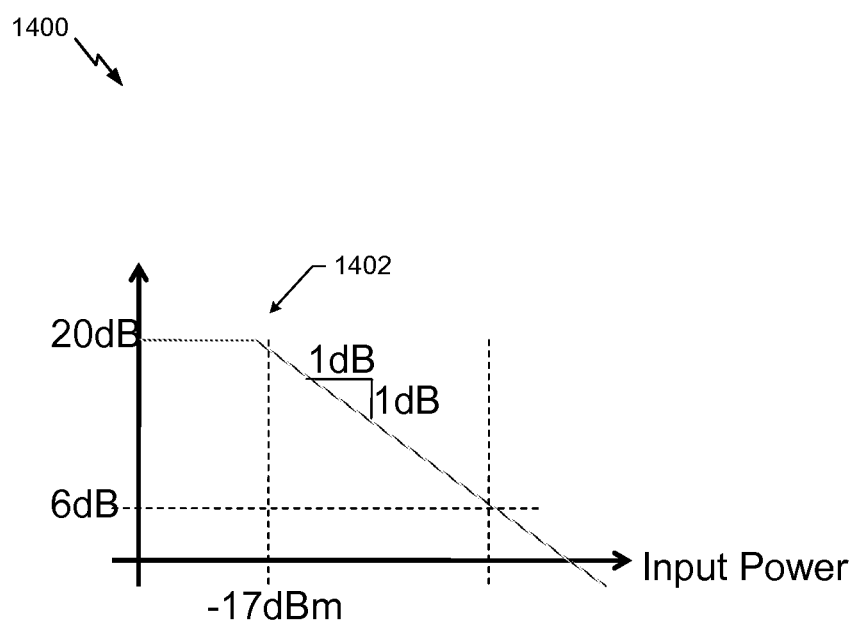
FIG. 14 shows an exemplary graph illustrating the gain characteristics of embodiments of a LNA coupled to a resonant T/R switch.

FIG. 14 shows an exemplary graph 1400 illustrating the bypass mode gain characteristics of embodiments of a LNA coupled to a resonant T/R switch. As indicated at 1402, the low-gain mode gain is 20 dB (From LNA input to Baseband (BB) output) and IP1 dB >−17 dBm. It is desirable to receive a higher input power signal. To achieve this assume well matched and small signal analysis, max gain at 0 dBm input power<6 dB to achieve the input power requirement without saturating the BB (assuming after gain compression there is 1 dB to 1 dB slope of Gain versus input power. This means that IP1 dB should be <−16 dBm.

To achieve this goal, the front end (FE) should compress that gain by 14 dB when compared to small signal gain. It will also be assumed that a 3 dB margin is provided for front end (FE) variation. Such gain adjustments can be provided by the exemplary circuit illustrated and described with reference to FIG. 15.

Low Gain Switch Improvement

Figure 15:
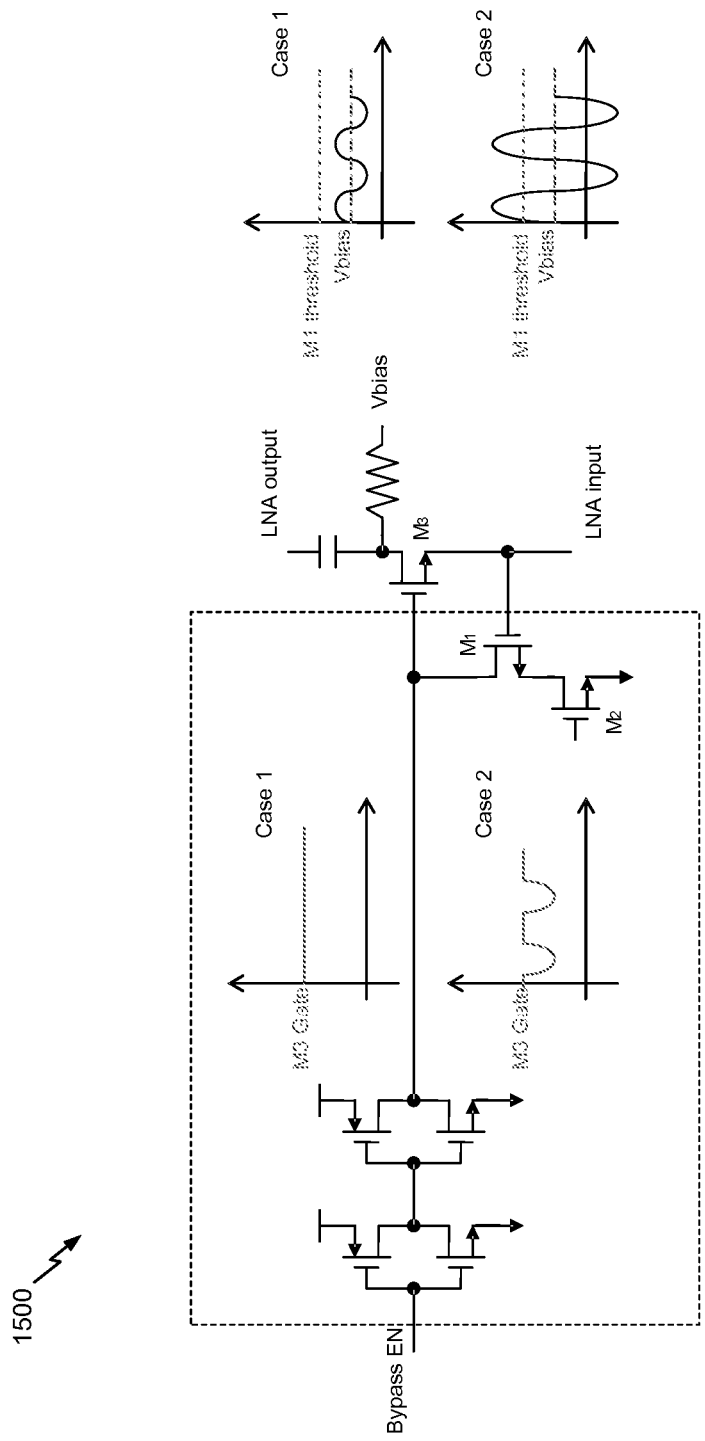
FIG. 15 shows an exemplary switch improvement suitable for use with embodiments of the LNA of FIG. 14.

FIG. 15 shows an exemplary control circuit 1500 suitable for use with embodiments of a resonant T/R switch and associated LNA. For example, the control circuit 1500 is suitable for use as the control circuit 606 shown in FIG. 6. The control circuit 1500 is operable to provide high power auto gain control to meet the requirements described with reference to FIG. 14.

During operation M1 acts as voltage detector and Vbias is set so that it is below the threshold voltage of M1.

Case 1: Small Signal

In this case, the LNA input signal is not high enough to turn on M1 so that the gate of M3 is high and no additional attenuation is provided.

Case 2: Large Signal

The input signal is large enough to turn on M1 to pull the gate of M3 down, which leads to a smaller gate-source voltage of M3 and more loss on the switch providing lower gain. Furthermore, M2 acts as is another tuning element.

Figure 16:
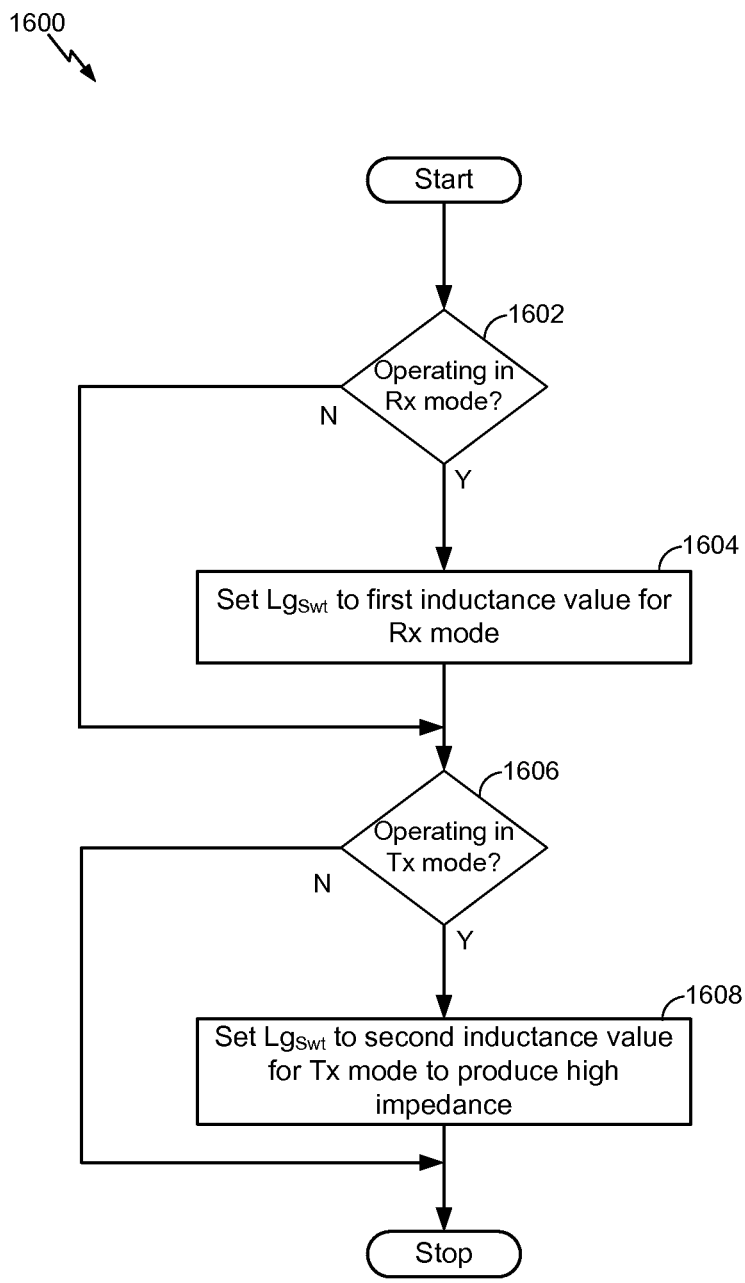
FIG. 16 shows an exemplary method for operating a resonant T/R switch in accordance with exemplary embodiments of the invention.

FIG. 16 shows an exemplary method 1600 for operating a resonant T/R switch in accordance with exemplary embodiments of the invention. For example, the method 1600 is suitable for use with the T/R switch 600 shown in FIG. 6. In other embodiments, the method is encoded or embodied as instruction or codes on a computer readable medium. The instructions or codes are executable by one or more processors to perform the functions described below.

At block 1602, a determination is made as to whether Rx is the current operating mode. If Rx is the current operating mode, the method proceeds to block 1604. If Rx is not the current operating mode, the method proceeds to block 1606.

At block 1604, the switchable inductor $Lg_{Swt}$ is set to provide its full inductance value for use in Rx mode. For example, the switch 614 is turned off. The full inductance value is gate source coupled by an achievable coupling factor to one or more inductors of an LNA which operates to reduce the required inductance value.

At block 1606, a determination is made as to whether Tx is the current operating mode. If Tx is the current operating mode, the method proceeds to block 1608. If Tx is not the current operating mode, the method ends.

At block 1608, the switchable inductor $Lg_{Swt}$ is set to provide a selected inductance value for use in Tx mode. For example, the selected inductance value is selected to resonant with parasitic capacitance of the antenna port to provide a high impedance. For example, the switch 614 is turned on to select the inductance for Tx mode.

Circuit Layout

Figure 17:
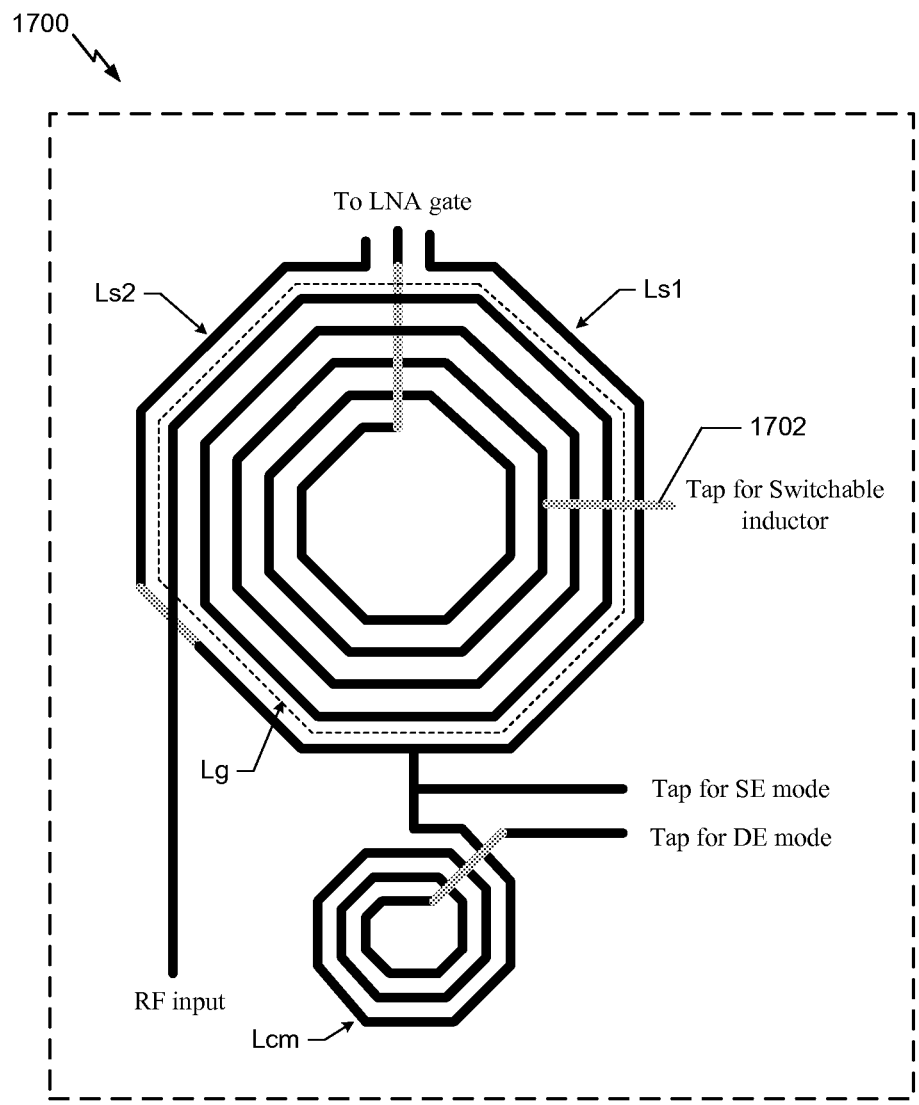
FIG. 17 shows an exemplary circuit layout for providing inductive coupling in accordance with exemplary embodiments of the invention.

FIG. 17 shows an exemplary circuit layout 1700 for providing gate source inductive coupling in accordance with embodiments of the resonant T/R switch. The circuit layout 1700 comprises a layout for switchable inductor $Lg_{swt}$, as circuit traces contained within the dashed line. Inductors Ls1 and Ls2, comprise traces that surround the inductor $Lg_{swt}$ by approximately one half of a turn and are therefore inductively coupled to $Lg_{swt}$. As a result, gate source coupling is produced which allows the values and sizes of the inductors to be reduced to achieve the advantages of the resonant T/R switch as described herein. Also shown is tap 1702 which is a tap to inductor $Lg_{swt}$ to allow for selection of a range of inductance values during Tx mode. It should be noted that the switchable inductor $Lg_{swt}$ can be formed using a variety of circuit techniques and is not limited to the implementation shown in FIG. 17. Furthermore, any suitable switch technique may be used to allow the switchable inductor $LG_{swt}$ to provide selection of a particular inductance value from one or more possible inductance values.

Figure 18:
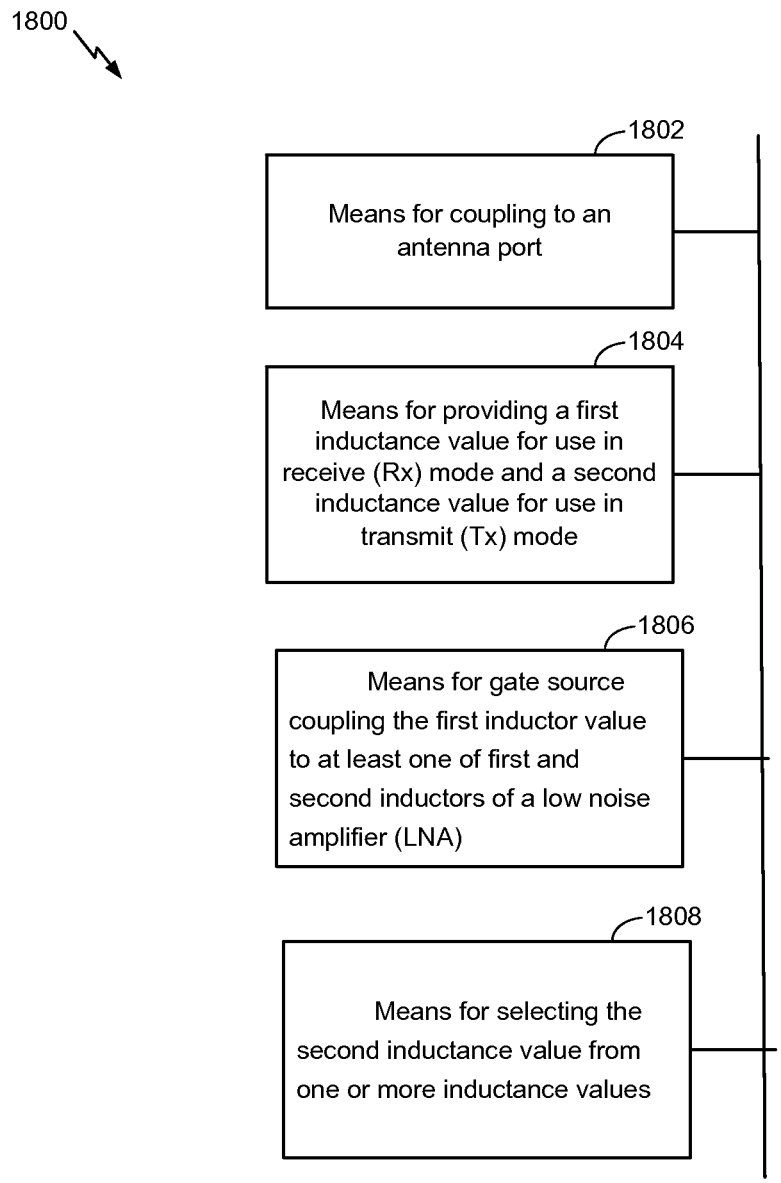
FIG. 18 shows an exemplary resonant T/R switch.

FIG. 18 shows exemplary resonant T/R switch 1800. For example, the switch 1800 is implemented by at least one integrated circuit comprising one or more modules as described herein. For example, in an aspect, each module comprises hardware and/or hardware executing software.

The T/R switch 1800 comprises a first module comprising means (1802) for coupling to an antenna port, which in an aspect comprises the node 612. The T/R switch 1800 also comprises a second module comprising means (1804) for providing a first inductance value for use in receive (Rx) mode and a second inductance value for use in transmit (Tx) mode, which in an aspect comprises the switchable inductor 602. The T/R switch 1800 also comprises a third module comprising means (1806) for gate source coupling said first inductor value to at least one of first and second inductors of a low noise amplifier (LNA), which in an aspect comprises the inductive coupling as illustrated in FIG. 17. The T/R switch 1800 also comprises a fourth module comprising means (1808) for selecting the second inductance value from one or more inductance values, which in an aspect comprises the switch 614.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. A circuit comprising:
   a first node operable to couple to an antenna port; and
   a resonant transmit/receive (T/R) switch coupled to the first node, wherein said switch comprises a switchable inductor having a first inductance value for use in receive (Rx) mode and a second inductance value for use in transmit (Tx) mode, and wherein said second inductance value is selected to resonant with parasitic capacitance of the antenna port to produce a high impedance value.

2. The circuit of claim 1, wherein the first inductance value is larger than the second inductance value.

3. The circuit of claim 1, wherein said switchable inductor comprises at least one tap that provides one or more inductance values from which the second inductance value may be selected.

4. The circuit of claim 1, further comprising a second switch that couples the at least one tap to ground during Tx mode.

5. The circuit of claim 1, wherein said switchable inductor is gate sourced coupled to at least one of first and second inductors of a low noise amplifier (LNA).

6. A method for operating a resonant transmit/receive (T/R) switch having a switchable inductor coupled to an antenna port, the method comprising:
   setting the switchable inductor to a first inductance value during a receive (Rx) mode to provide input matching to a low noise amplifier; and
   setting the switchable inductor to a second inductance value during a transmit (Tx) mode, wherein said second inductance value is selected to resonant with parasitic capacitance of the antenna port to produce a high impedance value.

7. The method of claim 6, wherein the first inductance value is larger than the second inductance value.

8. The method of claim 6, further comprising gate source coupling said switchable inductor to at least one of first and second inductors of the low noise amplifier (LNA).

9. The method of claim 6, further comprising selecting the second inductance value from one or more inductance values provided by said switchable inductor.

10. A resonant transmit/receive (T/R) switch comprising:
    means for coupling the switch to an antenna port; and
    means for providing a first inductance value for use in receive (Rx) mode and a second inductance value for use in transmit (Tx) mode, and wherein said second inductance value is selected to resonant with parasitic capacitance of the antenna port to produce a high impedance value.

11. The resonant transmit/receive (T/R) switch of claim 10, wherein the first inductance value is larger than the second inductance value.

12. The resonant transmit/receive (T/R) switch claim 10, further comprising means for gate source coupling said first inductor value to at least one of first and second inductors of a low noise amplifier (LNA).

13. The resonant transmit/receive (T/R) switch of claim 10, further comprising means for selecting the second inductance value from one or more inductance values.

14. A computer program product, comprising:
    a non transitory computer-readable medium encoded with a computer program, comprising:
    code for causing a switchable inductor to provide a first inductance value during a receive (Rx) mode to provide input matching to a low noise amplifier; and
    code for causing the switchable inductor to provide a second inductance value during a transmit (Tx) mode, wherein said second inductance value is selected to resonant with parasitic capacitance of an antenna port to produce a high impedance value.

15. The computer program product of claim 14, wherein the first inductance value is larger than the second inductance value.

16. The computer program product of claim 14, further comprising code for gate source coupling said first inductance value to at least one of first and second inductors of the low noise amplifier (LNA).

17. The computer program product of claim 14, further code for selecting the second inductance value from one or more inductance values.

* * * * *